(12) United States Patent
Arz

(10) Patent No.: US 6,597,174 B2
(45) Date of Patent: Jul. 22, 2003

(54) MAGNETIC RESONANCE APPARATUS WITH A PART THEREOF MADE OF FOAMED METAL FOR DAMPING MECHANICAL OSCILLATIONS

(75) Inventor: Winfried Arz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/195,919

(22) Filed: Jul. 16, 2002

(65) Prior Publication Data

US 2003/0016018 A1 Jan. 23, 2003

(30) Foreign Application Priority Data

Jul. 16, 2001 (DE) .......................................... 101 34 540

(51) Int. Cl.⁷ ................................................ G01N 3/00
(52) U.S. Cl. ...................................... 324/318; 324/322
(58) Field of Search ................................ 324/318, 322, 324/300, 306, 307, 309, 312, 314

(56) References Cited

U.S. PATENT DOCUMENTS

| 3,754,746 | A | * | 8/1973 | Thiele | ........................ 267/151 |
| 4,954,781 | A | | 9/1990 | Hirata | ........................ 324/318 |
| 5,192,624 | A | * | 3/1993 | Morimoto | .................... 428/596 |
| 5,617,026 | A | | 4/1997 | Yoshino et al. | ............. 324/318 |
| 5,841,279 | A | * | 11/1998 | Hayashi et al. | ............. 324/318 |
| 6,252,404 | B1 | | 6/2001 | Purgill et al. | ................ 324/318 |

OTHER PUBLICATIONS

Patent Abstracts of Japan Publication No. 2 001 036 282, and Translation of Japanese Application and 11206068.

* cited by examiner

*Primary Examiner*—Louis Arana
(74) *Attorney, Agent, or Firm*—Schiff Hardin & Waite

(57) ABSTRACT

In a magnetic resonance apparatus having at least one generator of mechanical oscillations, at least one part of the magnetic resonance apparatus is fashioned of a metal foam for damping the oscillations.

18 Claims, 3 Drawing Sheets

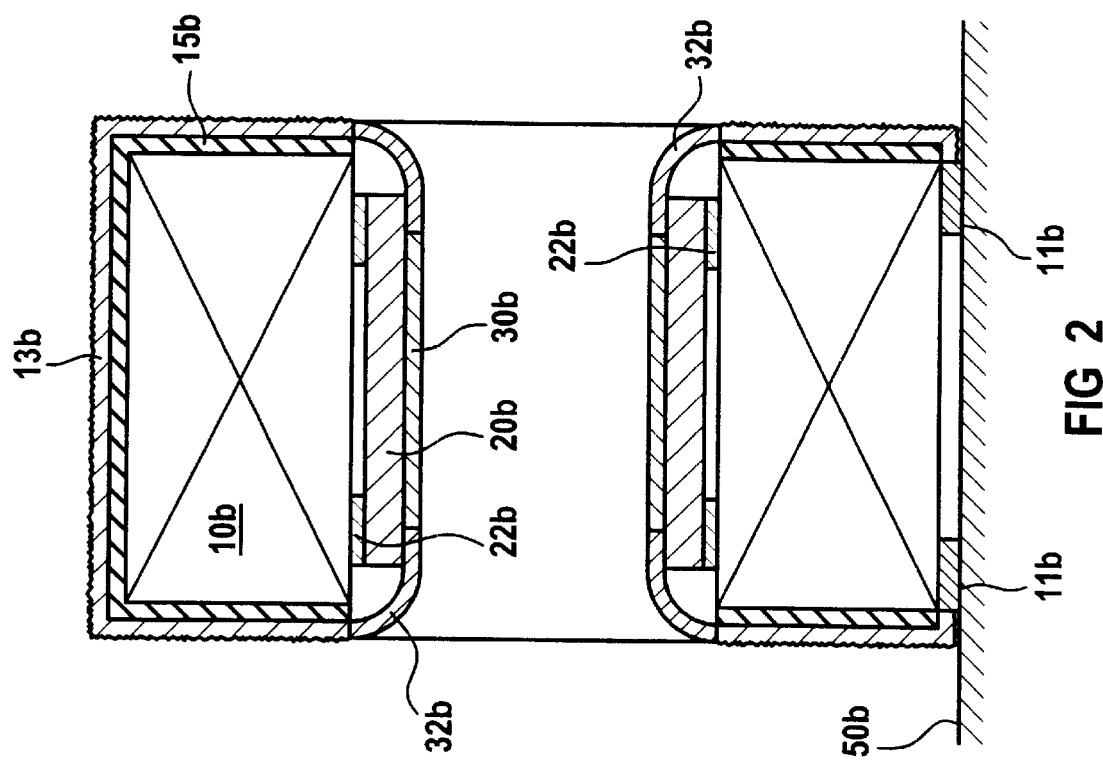
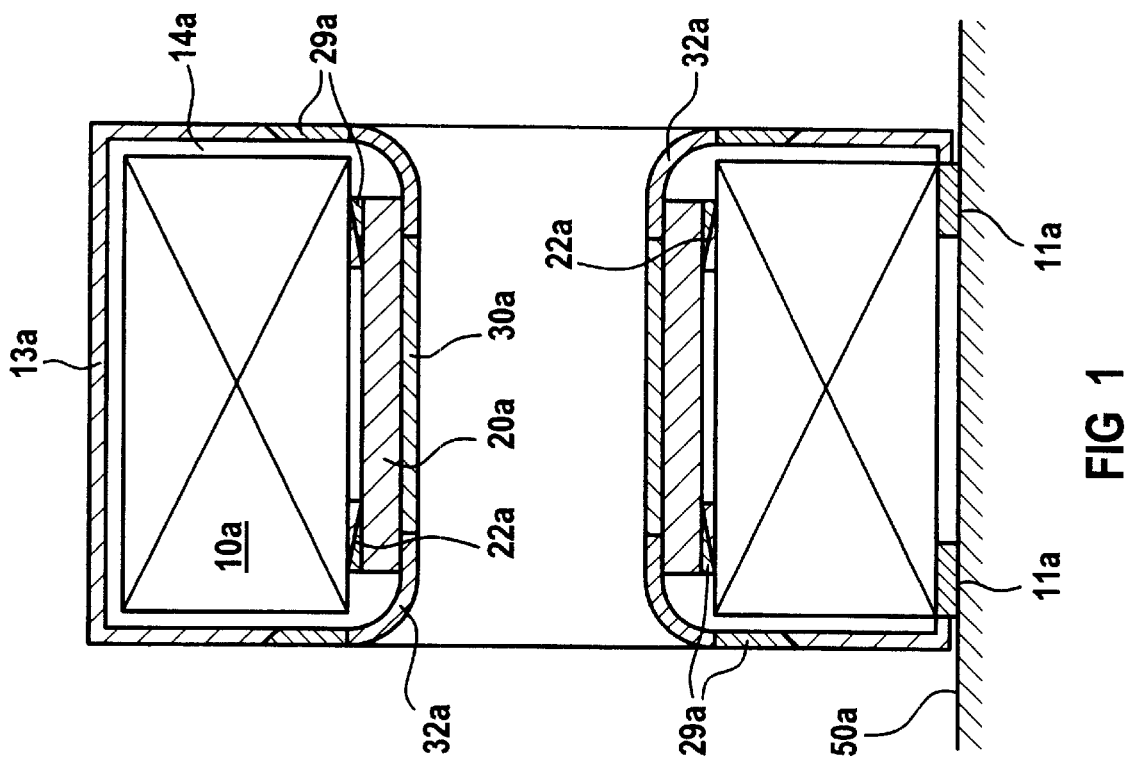

US 6,597,174 B2

MAGNETIC RESONANCE APPARATUS WITH A PART THEREOF MADE OF FOAMED METAL FOR DAMPING MECHANICAL OSCILLATIONS

BACKGROUND OF THE INVENTION

1. Field of the Invention

The present invention is directed to a magnetic resonance apparatus wherein mechanical oscillations are generated as a result of the operation of the apparatus.

2. Description of the Prior Art

Magnetic resonance technology is a known technique for acquiring images of the inside of the body of an examination subject. In a magnetic resonance apparatus, rapidly switched gradient fields that are generated by a gradient system are superimposed on a static basic magnetic field that is generated by a basic field magnet system. The magnetic resonance apparatus also has a radio-frequency system that beams radio-frequency signals into the examination subject for triggering magnetic resonance signals and picks up the resulting magnetic resonance signals from which magnetic resonance images are produced.

For generating gradient fields, suitable currents must be set in gradient coils of the gradient coil system. The amplitudes of the required currents amount to up to several 100 A. The current rise and decay rates can be up to several 100 kA/s. Given a basic magnetic field on the order of magnitude of 1 T, Lorentz forces that lead to oscillations of the gradient coil system act on these time-variable currents in the gradient coils. These oscillations are transmitted to the surface of the magnetic resonance apparatus via various propagation paths. At the surface, the mechanical oscillations are converted into acoustic oscillations that ultimately lead to unwanted noise.

A number of passive and active noise-reduction measures have been proposed for magnetic resonance apparatuses. For example, known passive noise reduction measures include the application of foamed materials for lining components toward the gradient coil system and/or the use of flexible layers at and/or in the gradient coil system. U.S. Pat. No. 4,954,781 discloses examples of such measures.

As an active noise reduction measure, for example, German OS 44 32 747 discloses the use of actuators allocated to the gradient coil system that, in particular, contain piezoelectric elements whose deformation can be controlled such that deformations of the gradient coil system that occur during operation of the magnetic resonance apparatus can be actively countered. The piezoelectric elements are appropriately controlled by means of an electrical voltage applied thereto. The introduction or attachment of a number of piezoelectric components into the gradient coil system, which is comparatively expansive in terms of space, and the voltage supply and the drive arrangement involve a great technological and economic outlay.

SUMMARY OF THE INVENTION

An object of the present invention is to provide an improved magnetic resonance apparatus wherein a highly noise-reducing effect can be achieved by means of a simple passive measure.

The above object is achieved in accordance with the principles of the present invention in a magnetic resonance apparatus wherein at least a part of the magnetic resonance apparatus is fashioned of foamed metal for damping the mechanical oscillations which arise during operation of the apparatus.

By forming at least a part of the magnetic resonance apparatus of foamed metal, whose intrinsic properties allow a fashioning of the part as needed for its function while also achieving a high sound absorption, additional noise reduction measures such as initially set forth as examples are superfluous. The part, for example, is a component of the magnetic resonance apparatus that is indispensable for an operation of the magnetic resonance apparatus. The following are particularly relevant as properties of the foamed metal that allow the part to be fashioned according to functional demands: The foamed metal exhibits a high isotropy, as a result whereof no limitations arise due to vectorial, privileged directions given multi-dimensional, complex structures. Relative to its weight, the foamed metal has a high specific rigidity. The foamed metal can be easily and flexibly processed, so free-form surfaces can be produced. Further, the foamed metal is non-combustible and its surface can be upgraded, structured and/or lacquered.

In an embodiment, at least one region of the foamed metal is filled with a substance, so that voids of the foamed metal are at least wetted or filled. The substance is thereby selected such that, for example, a mechanical damping and/or a thermal conductivity of the filled metal foam are set according to correspondingly defined rules. Visco-elastic polymers, for example polyurethane foams, can be utilized for setting the damping. A thermoplastic synthetic, for example, is injected into the metal foam as a substance for reducing the thermal conductivity. In one embodiment, filled and non-filled regions are arranged next to one another such that a directed heat conduction is achieved.

In another embodiment, at least one region of the metal foam is fashioned such that at least one property of the region is variable. For example, the weight of the region and its thermal conductivity as well are variable by undertaking a local variation of a metal structure density of the metal foam. Further, an increased acoustic absorption of the region can be achieved by fashioning the region with Helmholtz resonators that, for example, are fashioned a depressions in the shape of a truncated pyramid that proceed from a surface of the metal foam. The smaller of the end faces of a truncated pyramid thereby forms an opening of a depression that is accessible proceeding from the surface. The effect of the depression is that an acoustic wave front enters into the depression through the opening, is multiply reflected in the depression and thereby loses intensity. In another embodiment, the Helmholtz resonators are integrated into the metal foam a aperture-free chambers.

In an embodiment, a surface of the metal foam is fashioned in an open-pore manner. As a result of the open-pore fashioning of the surface of the aluminum foam, the sound absorption can be enhanced further compared to a closed-pore fashioning, similar to the result of the Helmholtz resonators. By contrast, a smooth surface or a low porosity produces a high reflectivity, so that only a small part of an acoustic power is absorbed in the metal foam.

In another embodiment, the metal foam is aluminum foam that, for example, is offered under the trademark ALULIGHT® by Alulight International GmbH in Ranshofen, Austria.

DESCRIPTION OF THE DRAWINGS

FIG. 1 is a longitudinal section through an inventive magnetic resonance apparatus having a cladding of a basic field magnet formed of aluminum foam that is spaced from the basic field magnet.

FIG. 2 is a longitudinal section through an inventive magnetic resonance apparatus with a cladding of a basic field magnet formed of aluminum foam and a visco-elastic layer between the basic field magnet and the cladding.

DESCRIPTION OF THE PREFERRED EMBODIMENTS

Figure 4:
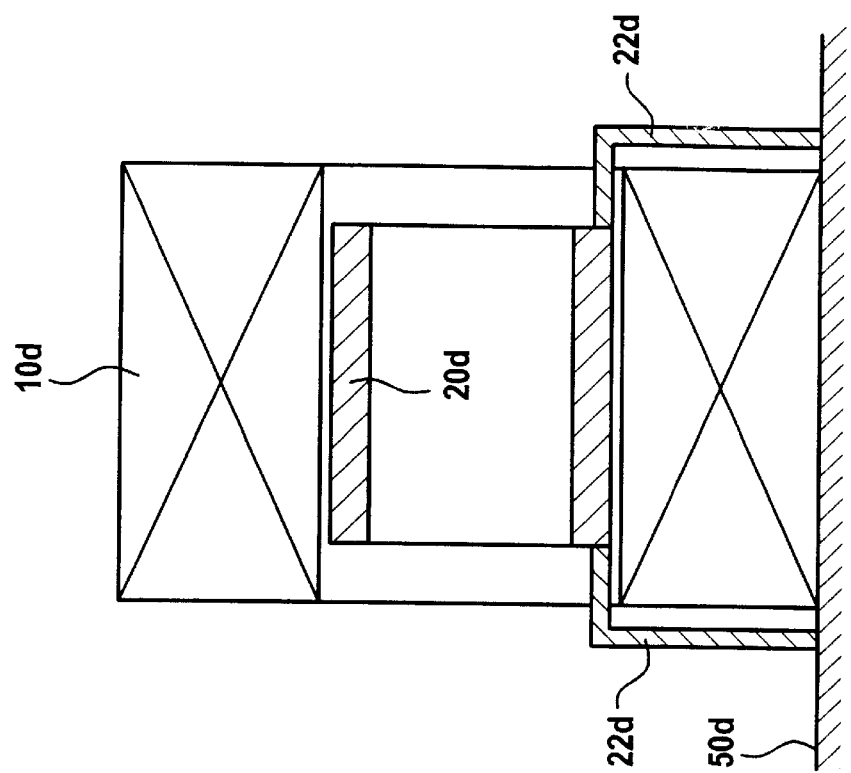
FIG. 4 is a longitudinal section through an inventive magnetic resonance apparatus wherein a gradient coil system is supported on a floor of an installation space of the magnetic resonance apparatus via a fastening mechanism of aluminum foam.

As an exemplary embodiment of the invention, FIG. 1 shows a longitudinal section through a magnetic resonance apparatus with a cladding 13a of aluminum foam. The magnetic resonance apparatus has an essentially hollow-cylindrical super-conducting basic field magnet 10a with which a uniform, static basic magnetic field can be generated. The basic field magnet 10a is connected to a floor 50a of an installation space of the magnetic resonance apparatus via magnet feet 11a.

A gradient coil system 20a, which is likewise essentially hollow-cylindrical, is arranged in the hollow interior of the basic field magnet 10a. Appropriate currents are set in gradient coils of the gradient coil system 20a for generating gradient fields. Given an existing basic magnetic field, Lorentz forces act on these time-variable currents. These Lorentz forces lead to mechanical oscillations of the gradient coil system 20a that are transmitted via various propagation paths to the surface of the magnetic resonance apparatus, where they are converted into acoustic oscillations that ultimately lead to unwanted noise. The magnetic resonance apparatus also has an antenna unit 30a, which is likewise essentially hollow-cylindrical and with which radio-frequency signals for triggering magnetic resonance signals can be emitted into an examination subject and with which the triggered magnetic resonance signals are picked up, from which magnetic resonance images are produced.

For an effective damping of the mechanical oscillations emanating from the gradient coil system 20a, the gradient coil system 20a is connected to the basic field magnet 10a via a fastening device 22a that is formed of aluminum foam. Similar to the fastening device 22a, the antenna unit 30a can be secured to the gradient coil system 20a with mounts formed of aluminum foam.

For damping acoustic oscillations proceeding from a surface of the basic field magnet 10a, the magnetic resonance apparatus also has the cladding 13a formed of aluminum foam. In interaction with a funnel-shaped lining 32a integrally attached to the antenna unit 30a, the cladding 13a is spaced from the basic field magnet 10a such that a space 14a arises essentially between the cladding 13a and the basic field magnet 10a, said space 14a being filled with air or being fashioned as a vacuum in another embodiment. That vacuum is particularly advantageous in view of an optimally low sound emission of the magnetic resonance apparatus. A surface of the cladding 13a formed of aluminum foam that faces toward the installation space is smooth, so that the surface can be lacquered in a simple way for achieving a prescribed appearance or an additional layer, for example a visco-elastic layer, is simple to apply.

The fastening device 22a as well as the cladding 13a formed of aluminum foam have regions 29a in which pores of the aluminum foam are wetted (covered) or filled with a substance having good thermal conductivity. A targeted removal of heat that arises during operation of the gradient coil system 20a away from the gradient coil system 20a in the direction of the installation space is thereby accomplished without, for example, the heat following a path via the basic field magnet 10a, so that the basic field magnet 10a is not undesirably heated.

As a further exemplary embodiment of the invention, FIG. 2 shows a longitudinal section through a magnetic resonance apparatus having a cladding 13b of aluminum foam. In contrast to the magnetic resonance apparatus shown in FIG. 1, the foamed aluminum cladding 13b of the magnetic resonance apparatus of FIG. 2 has a surface facing toward the installation space of the magnetic resonance apparatus at which the aluminum foam is not smooth but is open-pore. As a result, a sound emission from the surface can de intentionally influenced via a setting of a prescribable sound particle velocity of the surface.

Further, a space between the cladding 13b and the basic field magnet 10b is neither filled with air nor fashioned as a vacuum but is at least partially provided with a visco-elastic layer 15b for damping mechanical oscillations. The description above with regard to FIG. 1 applies analogously to the magnetic resonance apparatus of FIG. 2. Corresponding components of the magnetic resonance apparatus are provided with reference characters but with 'b' for identifying FIG. 2.

Figure 3:
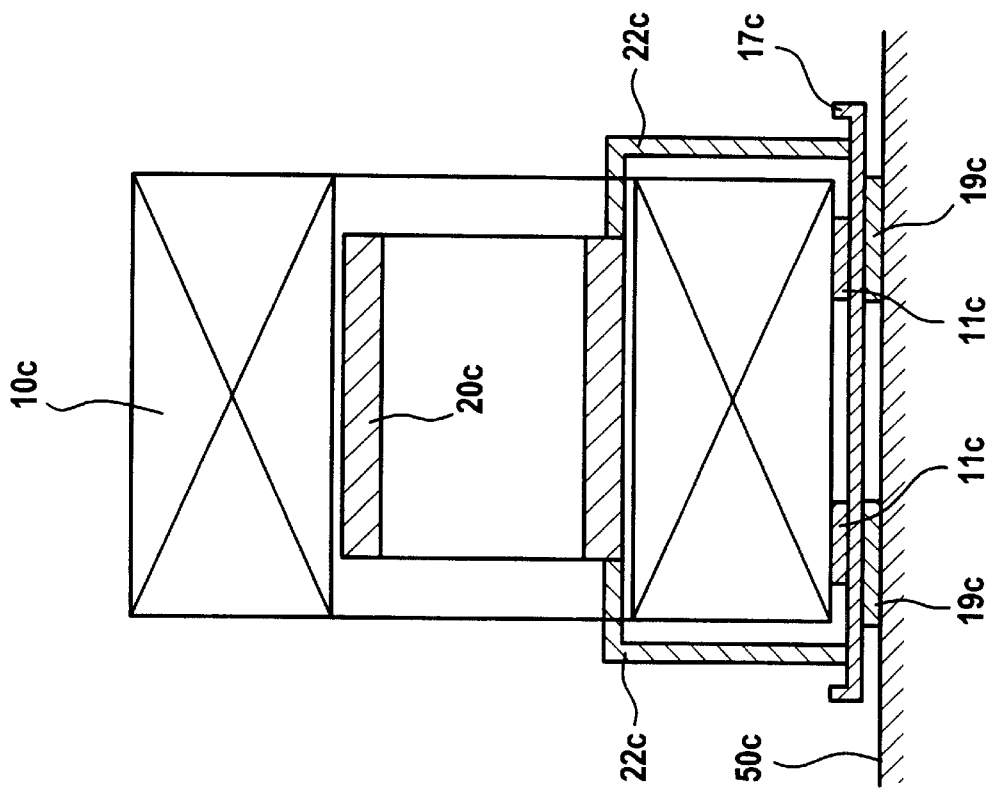
FIG. 3 is a longitudinal section through an inventive magnetic resonance apparatus with a magnet undercarriage of aluminum foam and a fastening mechanism of aluminum foam that supports a gradient coil system relative to the magnet undercarriage.

As a further exemplary embodiment of the invention, FIG. 3 shows a longitudinal section through a magnetic resonance apparatus having a magnet undercarriage 17c of aluminum foam and a fastening device 22c formed of aluminum foam for a gradient coil system 20c of the magnetic resonance apparatus. The magnetic resonance apparatus has an essentially hollow-cylindrical basic field magnet 10c that is connected via magnet feet 11c to a magnet undercarriage 17c fashioned of aluminum foam. Compared to a basic field magnet without undercarriage, the basic field magnet 10c connected to the magnet undercarriage 17c offers particular simplifications in assembly and transport of the basic field magnet 10c. The fashioning of the undercarriage 17c of aluminum foam is advantageous for a damping of mechanical oscillations of the magnetic resonance apparatus. The magnet undercarriage 17c is connected via shock absorbers 19c to a floor 50c of an installation space of the magnetic resonance apparatus.

The essentially hollow-cylindrical gradient coil system 20c of the magnetic resonance apparatus is arranged in the hollow interior of the basic field magnet 10c and, without a direct connection to the basic field magnet 10c, is supported on the magnet undercarriage 17c via a fastening device 22c of aluminum foam. As a result, a transmission of mechanical oscillations that emanate from the gradient coil system 20c during operation onto the magnet undercarriage 17c is effectively damped and, at the same time, direct transmission of the mechanical oscillations to the basic field magnet 10c is prevented.

As a further exemplary embodiment of the invention, FIG. 4 shows a longitudinal section through a magnetic resonance apparatus, wherein a gradient coil system 20d of the magnetic resonance apparatus is directed supported on a floor 50d of an installation space of the magnetic resonance apparatus via a fastening device 22d of aluminum foam. The essentially hollow-cylindrical gradient coil system 20d is arranged in the hollow interior of a likewise essentially hollow-cylindrical basic field magnet 10d.

The gradient coil system 20d is directly supported on the floor 50d of the installation space via the fastening device 22d of aluminum foam, so mechanical oscillations emanating from the gradient coil system 20d are effectively damped in the direction of the floor 50d, and, at the same time, direct transmission of mechanical oscillations to the basic field magnet 10d is prevented.

Figure 5:
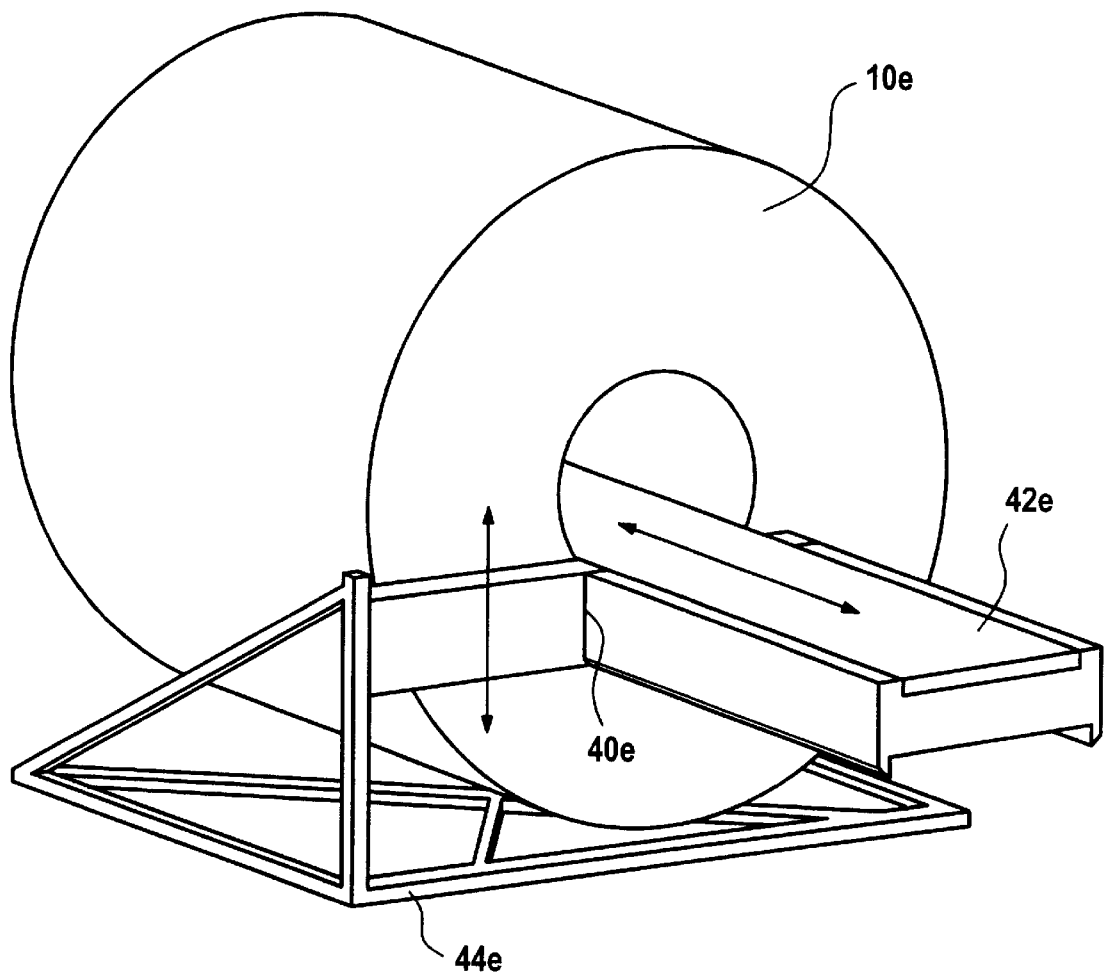
FIG. 5 is a perspective view of an inventive magnetic resonance apparatus having a displaceable support mechanism and a carrier frame for the bearing mechanism that is fashioned of aluminum foam.

As a further exemplary embodiment of the invention, FIG. 5 shows a perspective view of a magnetic resonance apparatus having an essentially hollow-cylindrical basic field magnet 10e in which a gradient coil system and an antenna unit are integrated, and having a carrying frame 44e of aluminum foam for a displaceable support mechanism 40e. The displaceable support mechanism 40e has a transport plate 42e that is movable in the horizontal direction. When the transport plate 42e is completely removed from the hollow interior of the basic field magnet 10e—the support mechanism 40e as a whole can be moved in the vertical direction relative to the carrying frame 44e along a vertical part of the carrying frame 44e.

The carrying frame 44e is rigidly attached to the basic field magnet 10e and is formed of aluminum foam for damping mechanical oscillations. Similar to the cladding 13a of the basic field magnet 10a of FIG. 1 or the cladding 13b of the basic field magnet 10b of FIG. 2, further, the support mechanism 40e can be fashioned with a corresponding cladding of aluminum foam.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   a plurality of apparatus components operable in combination to generate magnetic resonance data;
   at least one of said components contributing to generation of mechanical oscillations during the generation of said magnetic resonance data; and
   at least one of said apparatus components being formed of foamed metal for damping said mechanical oscillations.

2. A magnetic resonance apparatus as claimed in claim 1 wherein said at least one component formed of foamed metal damps forwarding of said mechanical oscillations toward an exterior of said plurality of apparatus components.

3. A magnetic resonance apparatus as claimed in claim 1 wherein said component which contributes to the generation of mechanical oscillations comprises a gradient coil system.

4. A magnetic resonance apparatus as claimed in claim 3 wherein said at least one component formed of foamed metal comprises a fastening device for said gradient coil system.

5. A magnetic resonance apparatus as claimed in claim 4 wherein said fastening device fastens said gradient coil system to at least one other apparatus component in said plurality of apparatus components.

6. A magnetic resonance apparatus as claimed in claim 4 wherein said fastening device is adapted for fastening said gradient coil system to an installation environment of said plurality of apparatus components.

7. A magnetic resonance apparatus as claimed in claim 1 wherein said plurality of apparatus components include a basic field magnet, and wherein said at least one component formed of foamed metal comprises a cladding at least partially surrounding said basic field magnet.

8. A magnetic resonance apparatus as claimed in claim 7 wherein said cladding is spaced from said basic field magnet.

9. A magnetic resonance apparatus as claimed in claim 8 wherein said cladding is spaced from said basic magnetic field by a volume containing a vacuum.

10. A magnetic resonance apparatus as claimed in claim 8 further comprising a damping layer disposed in at least a portion of said space between said cladding and said basic field magnet.

11. A magnetic resonance apparatus as claimed in claim 1 wherein said plurality of components include a patient support mechanism having a displaceable support, and wherein said at least one component formed of foamed metal comprises a carrier frame for said displaceable support, said carrier frame being rigidly connected to at least one other of said plurality of apparatus components.

12. A magnetic resonance apparatus as claimed in claim 1 wherein said plurality of apparatus components include a basic field magnet, and wherein said at least one component formed of foamed metal comprises an undercarriage for said basic field magnet.

13. A magnetic resonance apparatus as claimed in claim 1 wherein said at least one component formed of foamed metal has a region wherein a property of said region is variable.

14. A magnetic resonance apparatus as claimed in claim 13 wherein said foamed metal has pores, and wherein said pores of said foamed metal at least in said region are wetted with a substance which varies said at least one property.

15. A magnetic resonance apparatus as claimed in claim 13 wherein said foamed metal has pores, and wherein said pores of said foamed metal at least in said region are filled with a substance which varies said at least one property.

16. A magnetic resonance apparatus as claimed in claim 13 wherein said property is selected from the group consisting of weight, mechanical damping, an acoustic property, and thermal conductivity.

17. A magnetic resonance apparatus as claimed in claim 1 wherein said at least one apparatus component formed of foamed metal has a surface of said foamed metal that is open-pore.

18. A magnetic resonance apparatus as claimed in claim 1 wherein said foamed metal contains foamed aluminum.

* * * * *